United States Patent
Lin

(10) Patent No.: US 11,089,708 B1
(45) Date of Patent: Aug. 10, 2021

(54) HOUSING OF POWER SUPPLY

(71) Applicant: CHICONY POWER TECHNOLOGY CO., LTD., New Taipei (TW)

(72) Inventor: Yu-Jan Lin, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/884,168

(22) Filed: May 27, 2020

(30) Foreign Application Priority Data

Mar. 17, 2020 (TW) .................................. 109108840

(51) Int. Cl.
  *H05K 5/03* (2006.01)
  *H05K 7/14* (2006.01)
  *H05K 5/02* (2006.01)
  *H05K 5/04* (2006.01)

(52) U.S. Cl.
  CPC ............ *H05K 5/03* (2013.01); *H05K 5/0221* (2013.01); *H05K 5/0247* (2013.01); *H05K 5/04* (2013.01); *H05K 7/1417* (2013.01)

(58) Field of Classification Search
  None
  See application file for complete search history.

(56) References Cited

U.S. PATENT DOCUMENTS

| 7,254,011 | B2  | 8/2007  | Chen et al. |
| 7,495,925 | B2  | 2/2009  | Chen et al. |
| 7,699,281 | B2  | 4/2010  | Chen et al. |
| 7,700,875 | B2* | 4/2010  | Lalancette ............. H02G 3/086 174/51 |
| 7,835,149 | B2  | 11/2010 | Li et al. |
| 8,023,272 | B2* | 9/2011  | Shimizu ................. H01R 4/185 361/752 |
| 8,077,467 | B2  | 12/2011 | Chen et al. |
| 8,441,800 | B2* | 5/2013  | Sasaki ................ H05K 7/20854 361/752 |
| 8,564,962 | B2* | 10/2013 | Gong ................... H05K 7/1487 361/728 |
| 8,733,858 | B2  | 5/2014  | Cai et al. |
| 8,955,926 | B2  | 2/2015  | Gong |
| 8,973,879 | B2* | 3/2015  | Kodama .................. H02G 3/32 248/226.11 |

(Continued)

FOREIGN PATENT DOCUMENTS

| CN | 102339115 A | 2/2012 |
| CN | 205491481 U | 8/2016 |

*Primary Examiner* — Xanthia C Cunningham
(74) *Attorney, Agent, or Firm* — Muncy, Geissler, Olds & Lowe, P.C.

(57) ABSTRACT

A housing of a power supply includes a first cover and a second cover. The first cover includes a first sideboard and a hook. The first cover is configured with a first opening. The hook is disposed aside a side edge of the first opening and protrudes toward an inner side of the first cover. The second cover includes a second sideboard and a protruding platform. The protruding platform is disposed on the second sideboard and protrudes toward an outer side of the second cover. The protruding platform has a buckle hole. When the first cover is assembled with the second cover, the first sideboard is stacked on the outer side of the second sideboard, the protruding platform is engaged with the first opening, and the hook is engaged with the buckle hole.

12 Claims, 10 Drawing Sheets

(56) References Cited

U.S. PATENT DOCUMENTS

| | | | |
|---|---|---|---|
| 9,444,183 B2* | 9/2016 | Degen | H01R 13/627 |
| 9,648,766 B1* | 5/2017 | Eom | H05K 5/0217 |
| 10,181,667 B1* | 1/2019 | Hemnani | H01R 13/2435 |
| 10,899,474 B1* | 1/2021 | Misso, III | B64F 1/364 |
| 2010/0149778 A1 | 6/2010 | Yeh et al. | |
| 2010/0301181 A1 | 12/2010 | Chen | |
| 2011/0273843 A1 | 11/2011 | Chen et al. | |
| 2017/0018883 A1* | 1/2017 | Chen | H01R 13/6585 |

* cited by examiner

HOUSING OF POWER SUPPLY

CROSS REFERENCE TO RELATED APPLICATIONS

This Non-provisional application claims priority under 35 U.S.C. § 119(a) on Patent Application No(s). 109108840 filed in Taiwan, Republic of China on Mar. 17, 2020, the entire contents of which are hereby incorporated by reference.

BACKGROUND

Technology Field

The present disclosure relates to a housing of a power supply and, in particular, to a housing that can saving the assembling cost.

Description of Related Art

In order to increase the heat dissipation efficiency, the housing of the conventional power supply is usually provided with two fixing bars (such as metal bars) on two sides of the housing, respectively. In detailed, the upper and lower housings of the power supply are assembled together, and then two fixing bars are positioned manually with a jig. Afterwards, an adhesive tape is provided to wrap the fixing bars on both sides of the housing. Although this method can increase the heat dissipation efficiency of the housing, the operation of the jig manually and the positioning step of the fixing bars with the adhesive tape will increase the steps for assembling the housing, the assembling time and the production cost, and decrease the production efficiency.

Therefore, it is desired to provide a housing of a power supply that can be manufactured without the manual operation of the jig and the positioning step of the fixing bars with the adhesive tape, thereby preventing the increased steps for assembling the housing, the increased assembling time, the increased production cost, and the decreased production efficiency.

SUMMARY

An objective of this disclosure is to provide a housing of a power supply. Compared with the conventional art, the housing of this disclosure does not need the manual operation of the jig and the positioning step of the fixing bars with the adhesive tape, but directly assemble the fixing bars on the housing, thereby reducing the assembling steps, the assembling time and the production cost, and improving the production efficiency.

To achieve the above, this disclosure provides a housing of a power supply, which comprises a first cover and a second cover. The first cover comprises a first sideboard and a hook. The first sideboard is configured with a first opening. The hook is disposed aside a side edge of the first opening and protrudes toward an inner side of the first cover. The second cover comprises a second sideboard and a protruding platform. The protruding platform is disposed on the second sideboard and protrudes toward an outer side of the second cover. The protruding platform has a buckle hole. When the first cover is assembled with the second cover, the first sideboard is stacked on an outer side of the second sideboard, the protruding platform is engaged with the first opening, and the hook is engaged with the buckle hole.

In one embodiment, the hook has a stair-like shape, and when the first cover is assembled with the second cover, an upper edge portion of the hook contacts an inner sidewall of the protruding platform.

In one embodiment, when the first cover is assembled with the second cover, a center portion of the hook contacts against a side edge of the buckle hole.

In one embodiment, the first sideboard further comprises at least a first locking portion extending toward an outer side of the first cover.

In one embodiment, the housing further comprises a third cover configured with a third sideboard stacked on the first sideboard, wherein the third sideboard is configured with at least a second locking portion extending toward an outer side of the third cover.

In one embodiment, the housing further comprises a fixing bar configured with a locking slot corresponding to the first locking portion of the first sideboard or the second locking portion of the third sideboard, and the fixing bar is rotationally locked to the first locking portion or the second locking portion through the locking slot.

In one embodiment, the first sideboard is further configured with a second opening, and the second sideboard is configured with a third locking portion corresponding to the second opening and extending toward the first cover.

In one embodiment, the housing further comprises a fixing bar configured with a groove corresponding to the third locking portion, wherein the fixing bar is locked to the third locking portion through the groove.

In one embodiment, the first sideboard or the third sideboard is further configured with at least a protruding block, the fixing bar is further configured with at least a third opening, and the third opening is correspondingly engaged with the protruding block.

In one embodiment, the first sideboard is further configured with at least a protruding block, the fixing bar is further configured with at least a fourth opening, and the fourth opening is correspondingly engaged with the protruding block.

As mentioned above, the housing of a power supply of this disclosure can directly assemble the fixing bars on the housing instead of manually operating with the jig and the positioning step of the fixing bars with the adhesive tape, so that this disclosure can reduce the assembling steps, the assembling time and the production cost, and improve the production efficiency.

BRIEF DESCRIPTION OF THE DRAWINGS

The disclosure will become more fully understood from the detailed description and accompanying drawings, which are given for illustration only, and thus are not limitative of the present disclosure, and wherein:

FIG. 1F is a sectional view of the housing of FIG. 1A along the line A-A;

DETAILED DESCRIPTION OF THE DISCLOSURE

The present disclosure will be apparent from the following detailed description, which proceeds with reference to the accompanying drawings, wherein the same references relate to the same elements.

The housing of a power supply of this disclosure can directly assemble the fixing bars on the housing instead of manually operating with the jig and the positioning step of the fixing bars with the adhesive tape, so that this disclosure can reduce the assembling steps, the assembling time and the production cost, and improve the production efficiency.

Figure 1A:
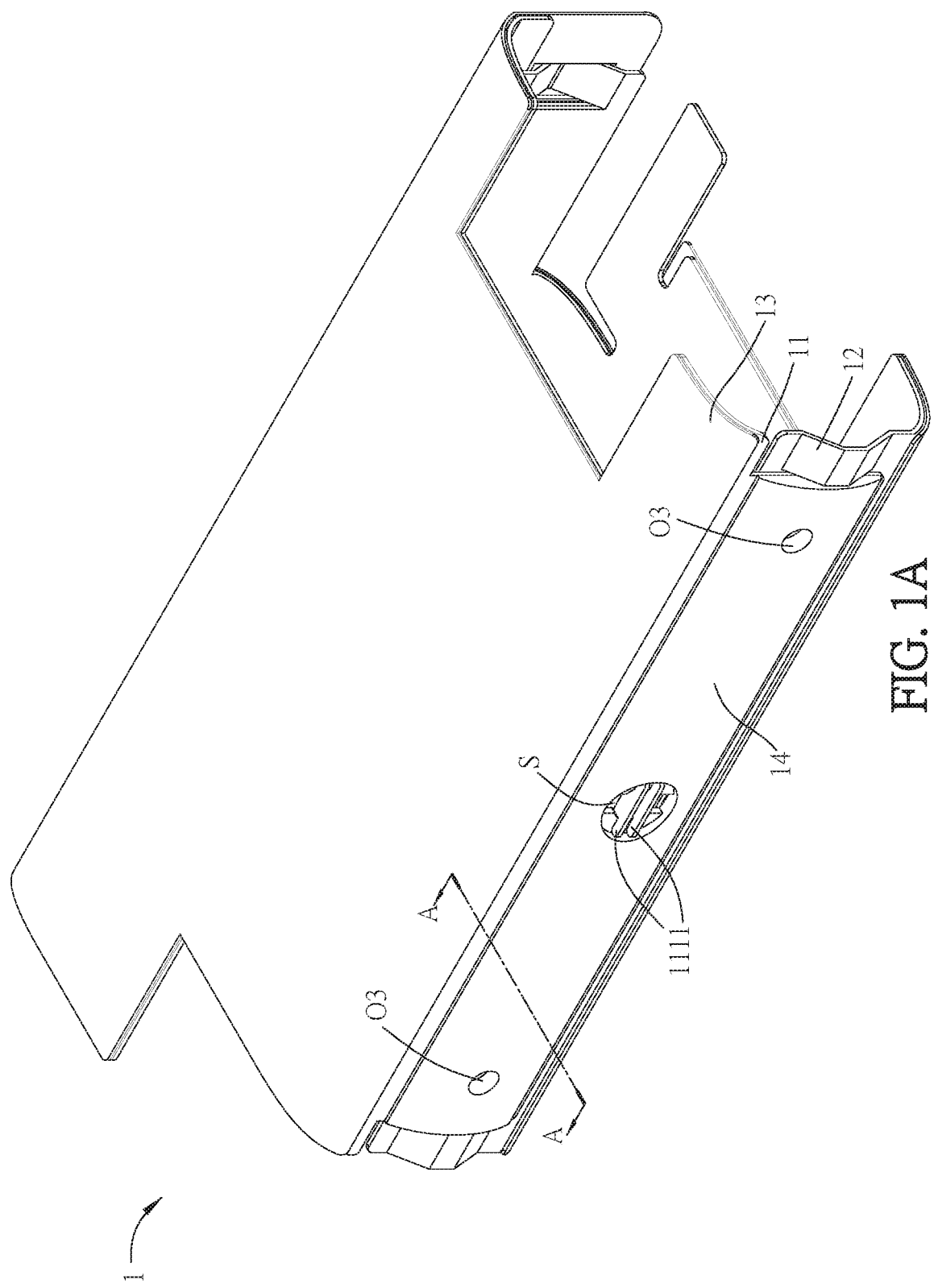
FIG. 1A is a schematic diagram showing a housing of a power supply according to a first embodiment of this disclosure.
Figure 1B:
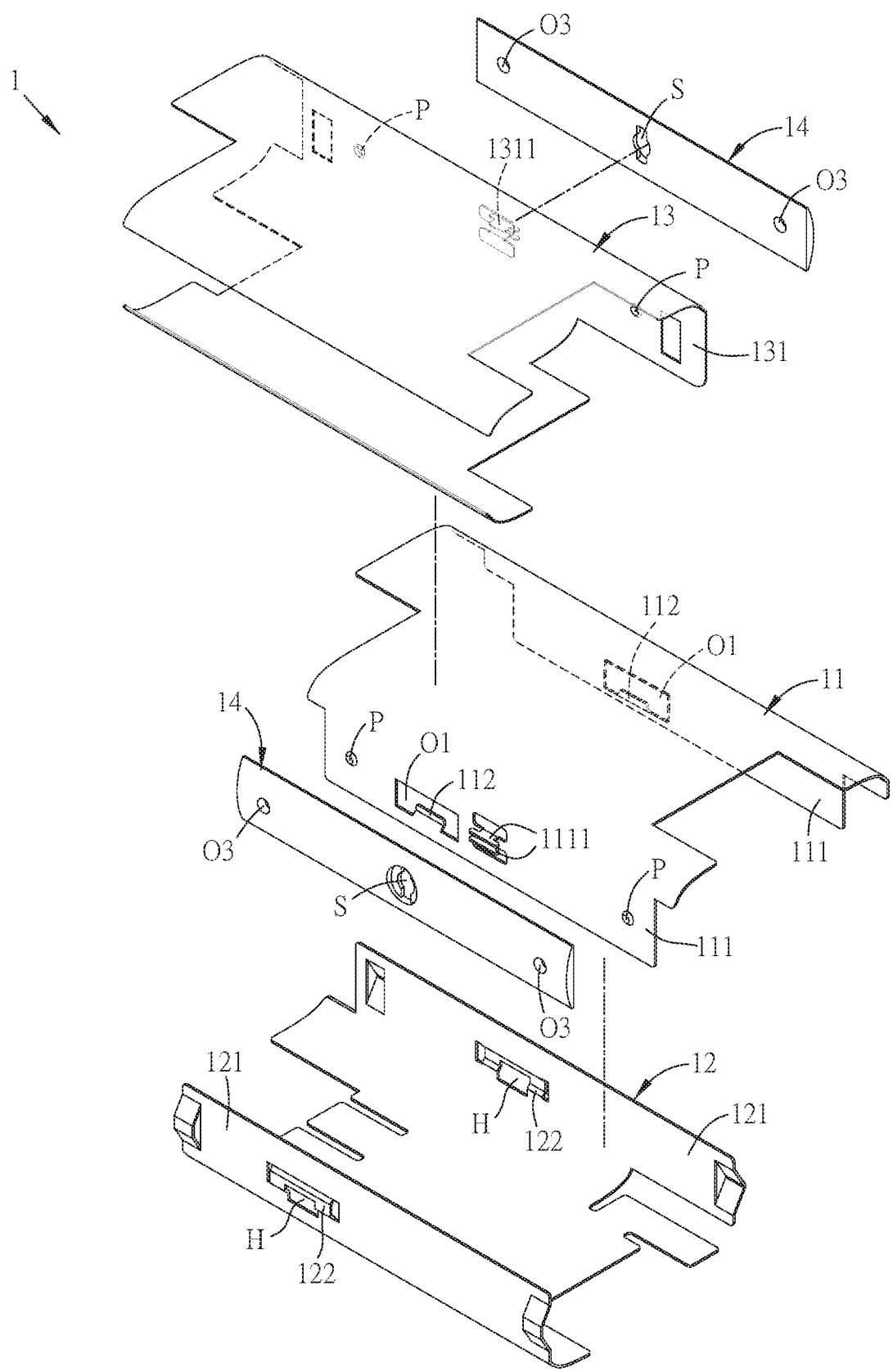
FIG. 1B is an exploded view of the housing of FIG. 1A.

FIG. 1A is a schematic diagram showing a housing of a power supply according to a first embodiment of this disclosure, and FIG. 1B is an exploded view of the housing of FIG. 1A. In this embodiment, as shown in FIGS. 1A and 1B, the housing 1 of a power supply comprises a first cover 11 and a second cover 12. The first cover 11 comprises a first sideboard 111 and a hook 112. The first sideboard 111 is configured with a first opening O1. The hook 112 is disposed aside a side edge of the first opening O1 and protrudes toward an inner side of the first cover 11. The second cover 12 comprises a second sideboard 121 and a protruding platform 122. The protruding platform 122 is disposed on the second sideboard 121 and protrudes toward an outer side of the second cover 12. The protruding platform 122 has a buckle hole H. In particular, the first cover 11 may comprise two first sideboards 111, which are disposed at two longer sides of the first cover 11, and the second cover 12 may comprise two second sideboards 121, which are disposed at two longer sides of the second cover 12.

Figure 1C:
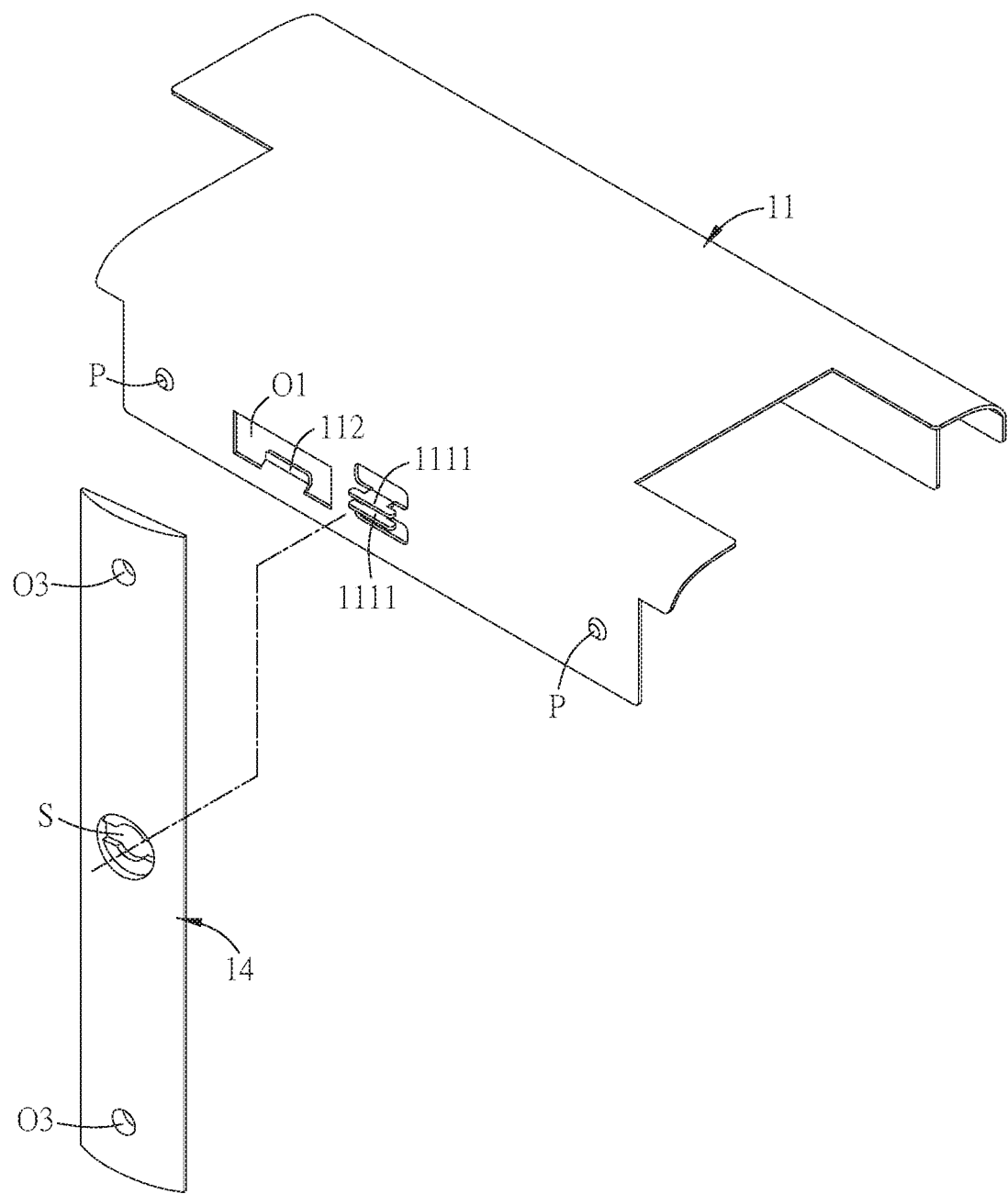
FIGS. 1C to 1F are schematic diagrams showing the assembling procedure of the housing of FIG. 1A.
Figure 1D:
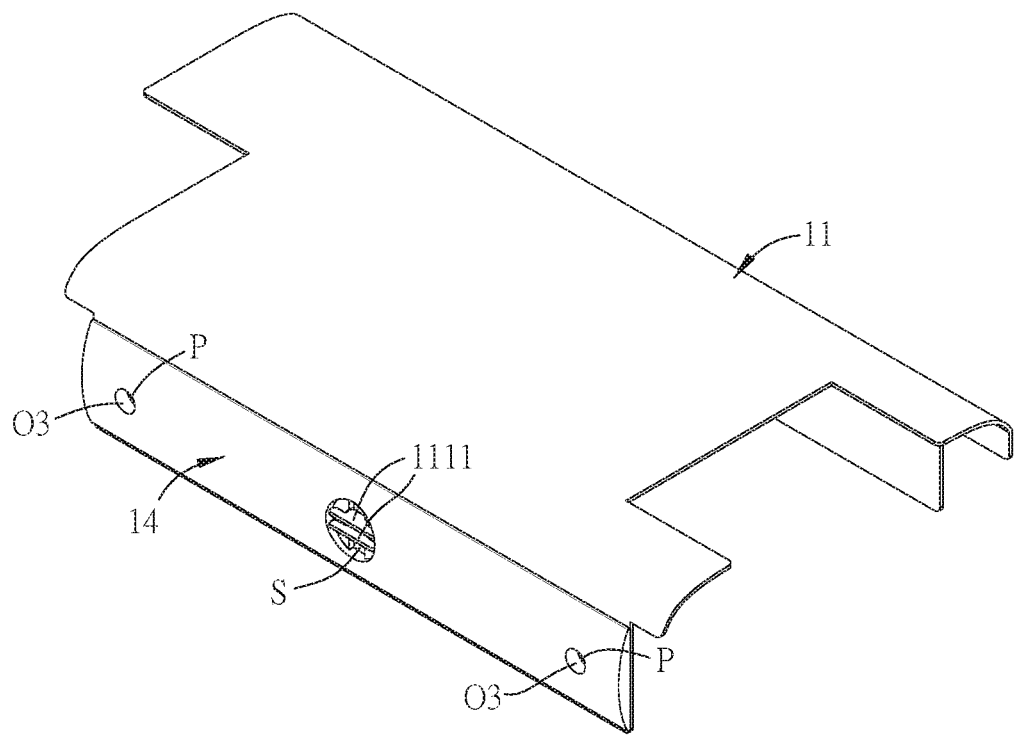
Figure 1E:
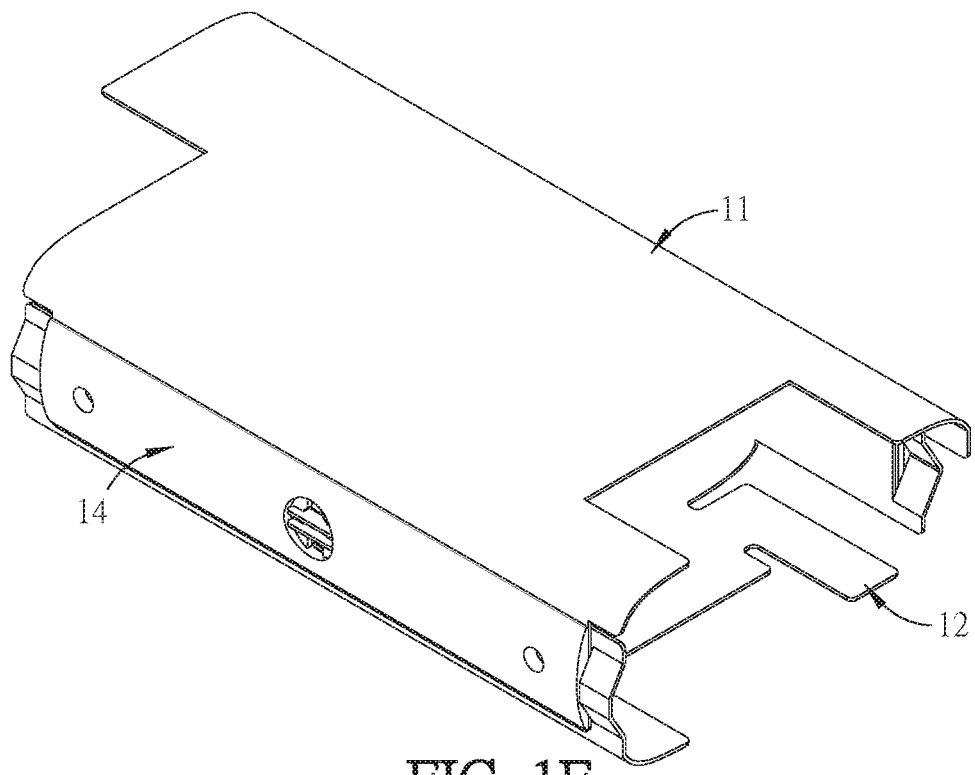
Figure 1F:
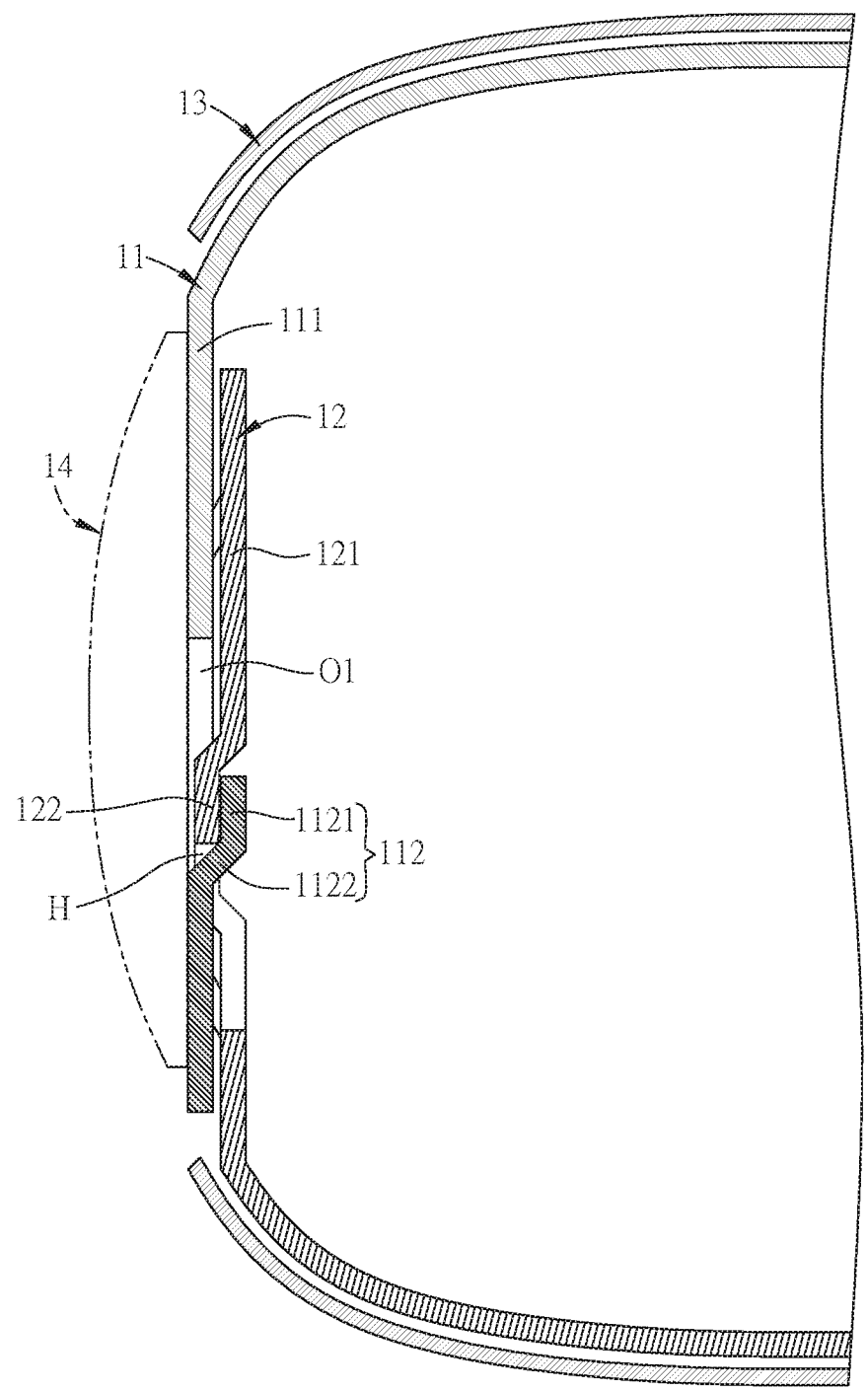

FIG. 1F is a sectional view of the housing 1 of FIG. 1A along the line A-A. In FIG. 1F, the fixing bar 14 is shown by dotted lines for emphasizing the connection relationships of the components when assembling the first cover 11 and the second cover 12. The function and connection relationship of the fixing bar 14 will be described later. In this embodiment, as shown in FIGS. 1B and 1F, when the first cover 11 is assembled with the second cover 12, the first sideboard 111 is stacked on an outer side of the second sideboard 121, the protruding platform 122 is engaged with the first opening O1, and the hook 112 is engaged with the buckle hole H. In more specific, the hook 112 has a stair-like shape. When the first cover 11 is assembled with the second cover 12, an upper edge portion 1121 of the hook 112 contacts an inner sidewall of the protruding platform 122, and a center portion 1122 of the hook 112 contacts against a side edge of the buckle hole H. Accordingly, the first cover 11 and the second cover 12 can be firmly assembled by the structural design of the first opening O1 of the first sideboard 111, the hook 112, the protruding platform 122, and the buckle hole H.

Referring to FIG. 1B, in this embodiment, the first sideboard 111 can further comprise at least a first locking portion 1111, which extends toward an outer side of the first cover 11. As shown in FIG. 1B, one of the first sideboards 111 is configured with two first locking portions 1111, and each first locking portion 1111 substantially has a T-shaped structure. The top part of the T-shaped structure extends toward the outer side of the first cover 11, and the bottom part of the T-shaped structure is connected with the first sideboard 111. To be noted, although this embodiment indicates that one of the first sideboards 111 is configured with two first locking portions 1111 for an example, the shape and amount of the first locking portion(s) 1111 can be adjusted based on the requirement of the user. The detailed function thereof will be described hereinafter.

Referring to FIGS. 1A and 1B, in this embodiment, the housing 1 can further comprise a third cover 13, and the third cover 13 is configured with a third sideboard 131 stacked on the first sideboard 111. The third sideboard 131 is configured with at least a second locking portion 1311 extending toward an outer side of the third cover 13. Specifically, the first cover 11 comprises two sideboards 111, and the third sideboard 131 of the third cover 13 is stacked on one of the first sideboards 111. Herein, the third cover 13 can be made of, for example but not limited to, metal or any of other high thermal-conductive materials for increasing the heat dissipation efficiency. In particular, the housing 1 can comprise the first cover 11 and the second cover 12 only. When the housing 1 comprises the first cover 11 and the second cover 12 only, the two first sideboards 111 of the first cover 11 have the same structure. When the housing 1 comprises the first cover 11, the second cover 12 and the third cover 13, the two first sideboards 111 of the first cover 11 have different structures. The first sideboard 111, which is stacked with the third sideboard 131, is not configured with the first locking portion 1111, and only the other first sideboard 111, which is not stacked with the third sideboard 131, is configured with the first locking portion 1111. Herein, the first sideboard 111, which is stacked with the third sideboard 131, is not exposed after assembling the three covers, and the other first sideboard 111, which is not stacked with the third sideboard 131, is exposed after assembling the three covers. The shape, structure and function of the second locking portion 1311 can be referred to the first locking portion 1111, and the details thereof will be described later.

FIGS. 1C to 1E are schematic diagrams showing the assembling procedure of the housing 1 of FIG. 1A. Referring to FIGS. 1A to 1C, in this embodiment, the housing 1 further comprises a fixing bar 14, and the fixing bar 14 is configured with a locking slot S corresponding to the first locking portion 1111 of the first sideboard 111 or the second locking portion 1311 of the third sideboard 131, and the fixing bar is rotationally locked to the first locking portion 1111 or the second locking portion 1311 through the locking slot S. In detailed, as shown in FIG. 1B, the housing 1 comprises two fixing bars 14, which are disposed at two longer sides of the housing, respectively. When the housing 1 comprises a first cover 11 and a second cover 12 only, each of the two first sideboards 111 of the first cover 11 is configured with two first locking portions 1111 (not shown.) When the housing 1 comprises a first cover 11, a second cover 12 and a third cover 13, the first sideboard 111 of the first cover 11, which is stacked with the third sideboard 131, is not configured with the first locking portion 1111, and only the other first sideboard 111, which is not stacked with the third sideboard 131, is configured with two first locking portions 1111. Herein, the first sideboard 111, which is stacked with the third sideboard 131, is not exposed after assembling the three covers, and the other first sideboard 111, which is not stacked with the third sideboard 131, is exposed after assembling the three covers. The third sideboard 131 is configured with two second locking portions 1311, and the structure and function of the second locking portions 1311 are the same as those of the first locking portion 1111. As shown in FIG. 1C, the fixing bar 14 is configured with a locking slot S corresponding to the first locking portion 1111 of the first sideboard 111 or the second locking portion 1311 of the third sideboard 131, and the fixing bar 14 is rotationally locked to the first locking portion 1111 or the second locking portion 1311 through the locking slot S. As shown in FIG. 1A, after rotationally locking the fixing bar 14 to the first locking portion 1111 or the second locking portion 1311, the top part of the T-shaped structure thereof can be firmly engaged with two inner walls of the locking slot S. This configuration of disposing the first locking portion 1111 and the second locking portion 1311 corresponding to the locking slot S can firmly fix the fixing bar 14 on the first sideboard 111 or the third sideboard 131. The fixing bar 14 can be made of, for example but not limited to, metal or any of other high thermal-conductive materials for increasing the heat dissipation efficiency.

Referring to FIG. 1B, in this embodiment, the first sideboard 111 or the third sideboard 131 is further configured with at least a protruding block P, the fixing bar 14 is further configured with at least a third opening O3, and the third opening O3 is correspondingly engaged with the protruding block P. The configuration of the third opening O3 and the protruding block P, which are disposed corresponding to each other, can firmly fix the fixing bar 14 on the first sideboard 111 or the third sideboard 131.

The assembling procedure of the housing 1 will be described with reference to FIGS. 1A to 1F. As shown in FIG. 1C, the locking slot S of the fixing bar 14 is aligned to the first locking portion 1111 of the first sideboard 111. After inserting the first locking portion 1111 into the locking slot S, the fixing bar 14 is rotated so as to correspondingly engage the first locking portion 1111 with the locking slot S. In addition, the third opening O3 of the fixing bar 14 is correspondingly engaged with the protruding block P of the first sideboard 111 for finishing the assembling of the fixing bar 14 (see FIG. 1D). Afterwards, the first cover 11 and the second cover 12 are correspondingly assembled (see FIG. 1E). After assembling the first cover 11 with the second cover 12, the first sideboard 111 is stacked on an outer side of the second sideboard 121, the protruding platform 122 is engaged with the first opening O1, and the hook 112 is engaged with the buckle hole H (see FIG. 1F). Finally, the third cover 13 is optionally provided to assemble with the first cover 11 and the second cover 12 for increasing the heat dissipation efficiency. If the third cover 13 is provided, only one fixing bar 14 is installed on the first locking portion 1111 of the first sideboard 111 at the beginning of the assembling procedure, and the other fixing bar 14 will be installed after disposing the third cover 13 on the assembled first cover 11 and second cover 12. In specific, the locking slot S of the other fixing bar 14 is aligned to the second locking portion 1311 of the third sideboard 131. After inserting the second locking portion 1311 into the locking slot S, the other fixing bar 14 is rotated so as to correspondingly engage the second locking portion 1311 with the locking slot S. In addition, the third opening O3 of the other fixing bar 14 is correspondingly engaged with the protruding block P of the third sideboard 131 for finishing the assembling of the other fixing bar 14.

Figure 2A:
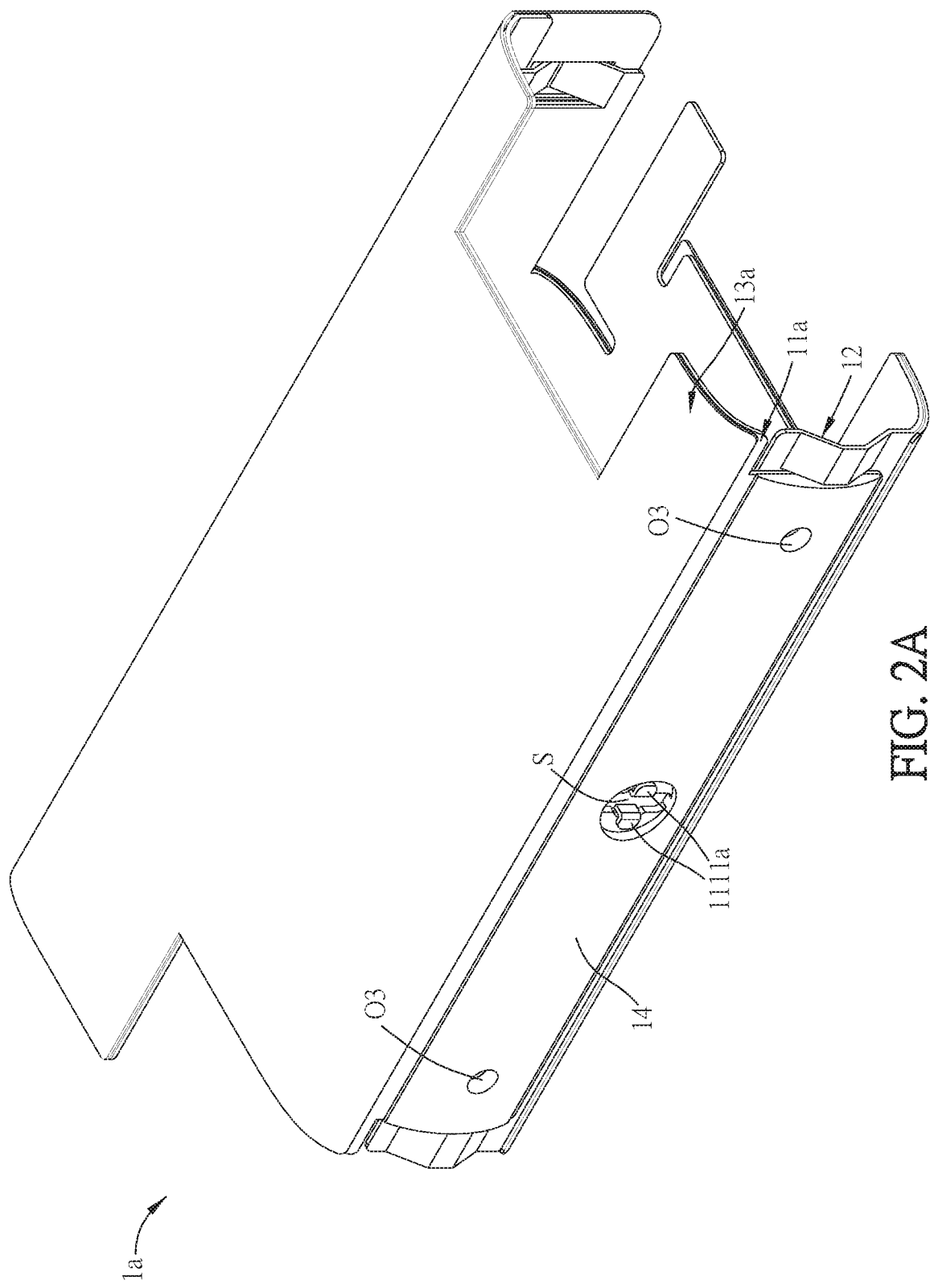
FIG. 2A is a schematic diagram showing a housing of a power supply according to a second embodiment of this disclosure.
Figure 2B:
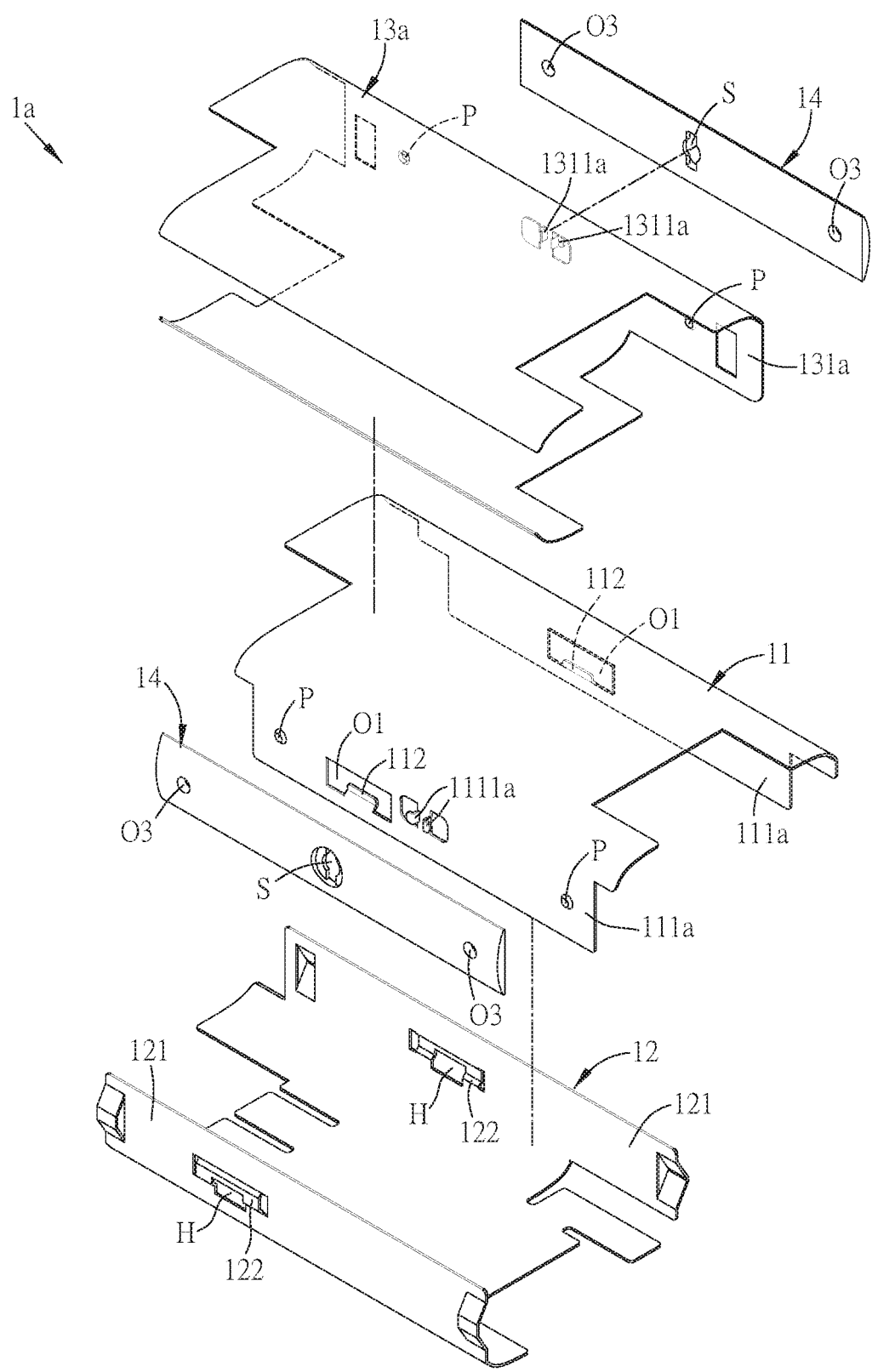
FIG. 2B is an exploded view of the housing of FIG. 2A.

FIG. 2A is a schematic diagram showing a housing 1a of a power supply according to a second embodiment of this disclosure, and FIG. 2B is an exploded view of the housing 1a of FIG. 2A. Referring to FIGS. 2A and 2B, the housing 1a of a power supply of this embodiment comprises a first cover 11a and a second cover 12. The first cover 11a comprises a first sideboard 111a and a hook 112. The first sideboard 111a is configured with a first opening O1. The hook 112 is disposed aside a side edge of the first opening O1 and protrudes toward an inner side of the first cover 11a. The second cover 12 comprises a second sideboard 121 and a protruding platform 122. The protruding platform 122 is disposed on the second sideboard 121 and protrudes toward an outer side of the second cover 12. The protruding platform 122 has a buckle hole H. The first sideboard 111a of the housing 1a further comprises at least a first locking portion 1111a, which extends toward an outer side of the first cover 11a. The housing 1a can further comprise a third cover 13a, and the third cover 13a is configured with a third sideboard 131a stacked on the first sideboard 111a. The third sideboard 131a is configured with at least a second locking portion 1311a extending toward an outer side of the third cover 13a. Particularly, the structure, components, function and assembling method of the housing 1a are mostly the same as those of the housing 1 of the above-mentioned first embodiment, so the detailed descriptions thereof will be omitted. The different between the housings 1 and 1a of the first and second embodiments is in the locking structure of the fixing bar. Specifically, the first locking portion 1111a (or the second locking portion 1311a) is substantially a reversed L-shaped structure. The top part of the L-shaped structure is connected with the first sideboard 111a (or the third sideboard 131a), and the bottom part of the L-shaped structure extends toward the outer side of the first cover 11a (or the third cover 13a). To be noted, although the shapes and structures of the first locking portion 1111a and the second locking portion 1311a of the housing 1a are different from those of the first locking portion 1111 and the second locking portion 1311 of the housing 1, they can have the same function for rotationally locking the fixing bar 14 to the first sideboard 111/111a or the third sideboard 131/131a through the locking slot S. In this embodiment, the bottom parts of the L-shaped structures of the first locking portion 1111a and the second locking portion 1311a can be engaged with two inner walls of the locking slot S.

Figure 3A:
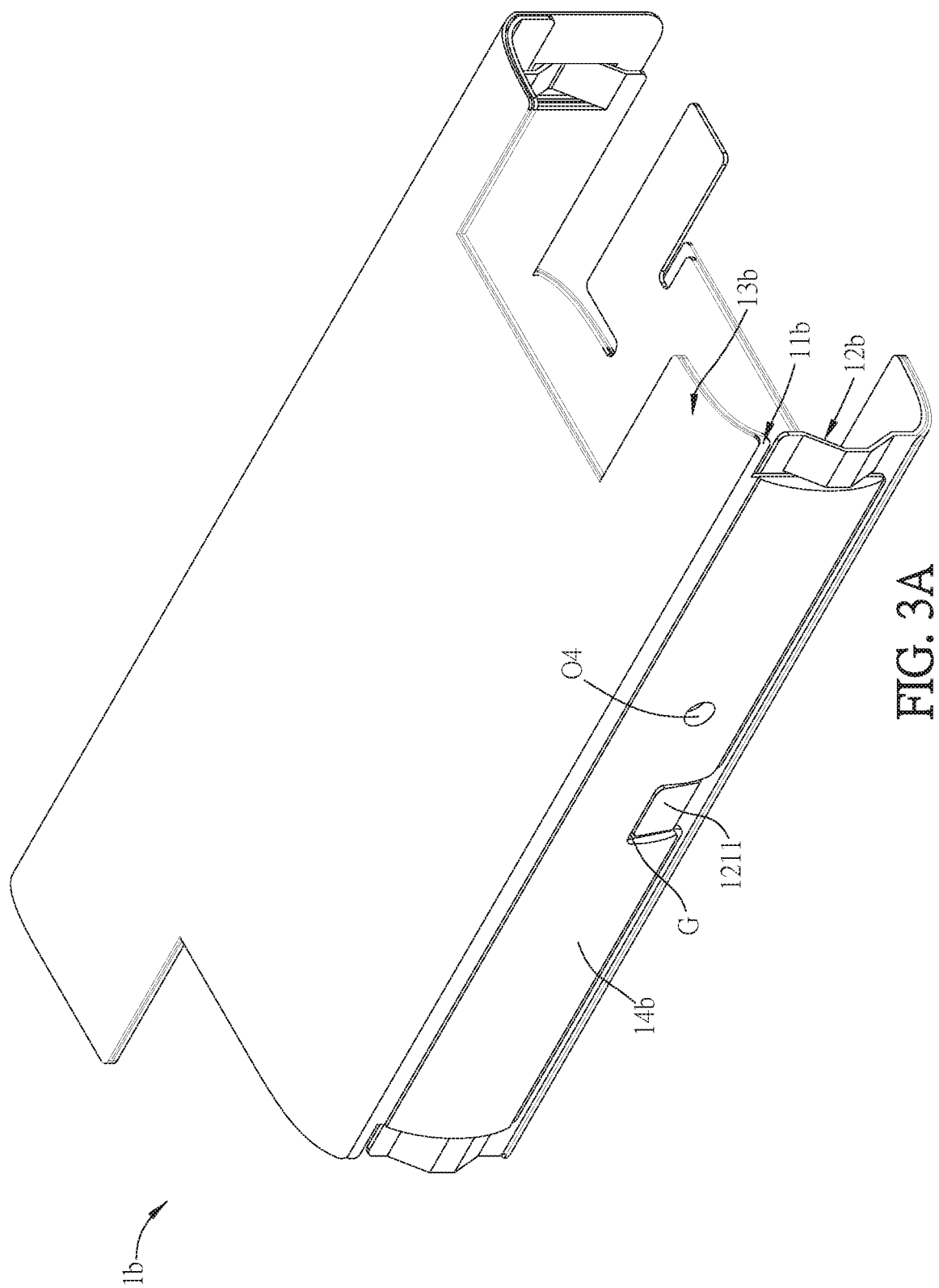
FIG. 3A is a schematic diagram showing a housing of a power supply according to a third embodiment of this disclosure.
Figure 3B:
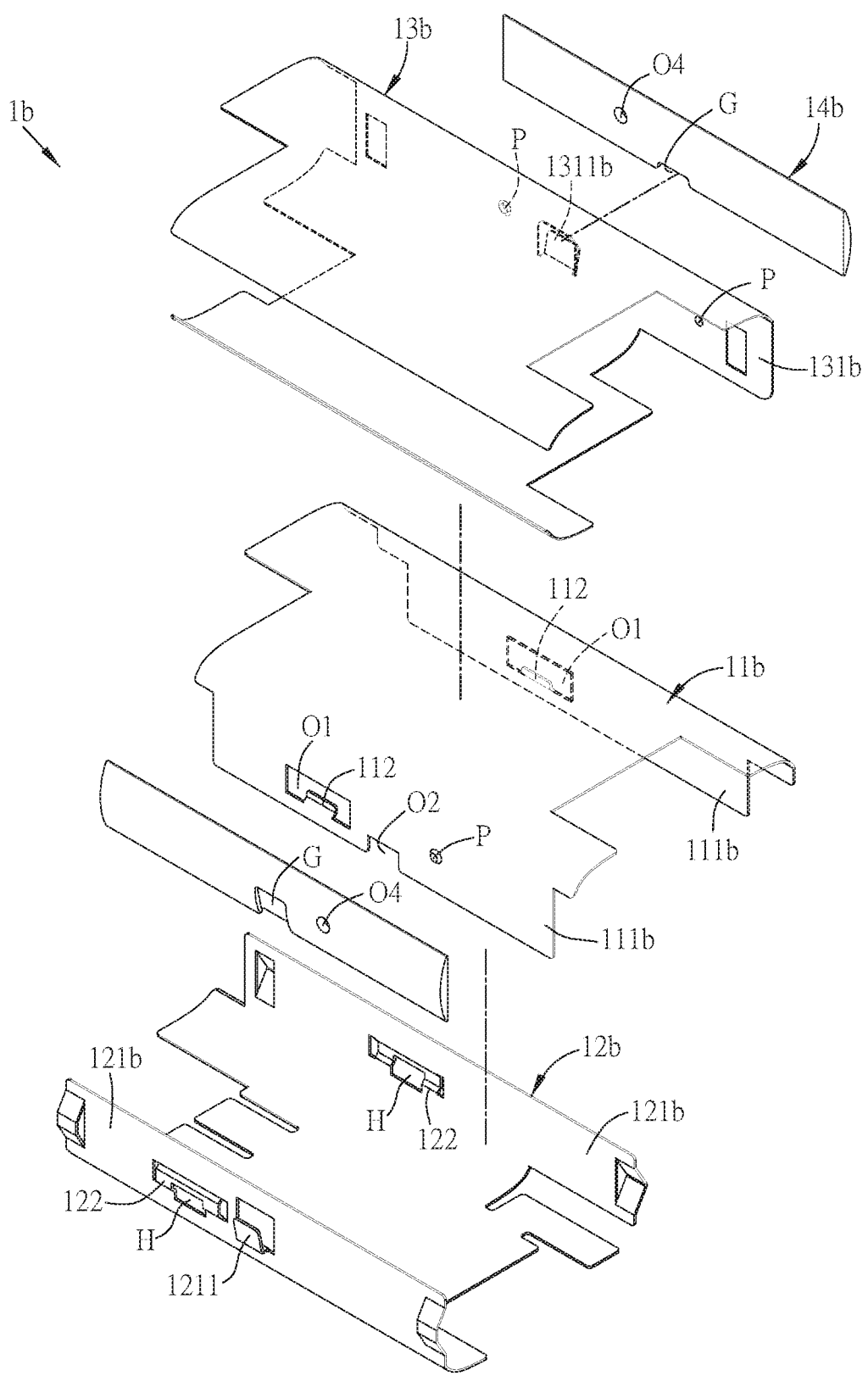
FIG. 3B is an exploded view of the housing of FIG. 3A.

FIG. 3A is a schematic diagram showing a housing 1b of a power supply according to a third embodiment of this disclosure, and FIG. 3B is an exploded view of the housing 1b of FIG. 3A. Referring to FIGS. 3A and 3B, the housing 1b of a power supply of this embodiment comprises a first cover 11b and a second cover 12b. The first cover 11b comprises a first sideboard 111b and a hook 112. The first sideboard 111b is configured with a first opening O1. The hook 112 is disposed aside a side edge of the first opening O1 and protrudes toward an inner side of the first cover 11b. The second cover 12b comprises a second sideboard 121b and a protruding platform 122. The protruding platform 122 is disposed on the second sideboard 121b and protrudes toward an outer side of the second cover 12b. The protruding platform 122 has a buckle hole H. The housing 1b can further comprise a third cover 13b, and the third cover 13b is configured with a third sideboard 131b stacked on the first sideboard 111b. The third sideboard 131b is configured with at least a second locking portion 1311b extending toward an outer side of the third cover 13b. Particularly, the structure, components and function of the housing 1b are mostly the same as those of the housing 1 of the above-mentioned first embodiment, and the different between the housings 1 and 1b of the first and third embodiments is in the locking structure of the fixing bar. Specifically, the first sideboard 111b of the housing 1b can be further configured with a second opening O2, and the second sideboard 121b is configured with a third locking portion 1211 corresponding to the second opening O2 and extending toward the first cover 11*b*. In this case, the third locking portion 1211 is substantially a reversed L-shaped structure. The top part of the L-shaped structure is connected with the second sideboard 121*b*, and the bottom part of the L-shaped structure extends toward the first cover 11*b*. To be noted, the shape, structure and function of the second locking portion 1311*b* are the same as those of the third locking portion 1211. In this embodiment, the housing 1*b* can further comprise a fixing bar 14*b* configured with a groove G corresponding to the third locking portion 1211, and the fixing bar 14*b* is locked to the third locking portion 1211 or the second locking portion 1311*b* through the groove G In addition, the first sideboard 111*b* or the third sideboard 131*b* can be further configured with at least a protruding block P, and the fixing bar 14 can be further configured with at least a fourth opening O4. The fourth opening O4 is correspondingly engaged with the protruding block P.

Figure 3C:
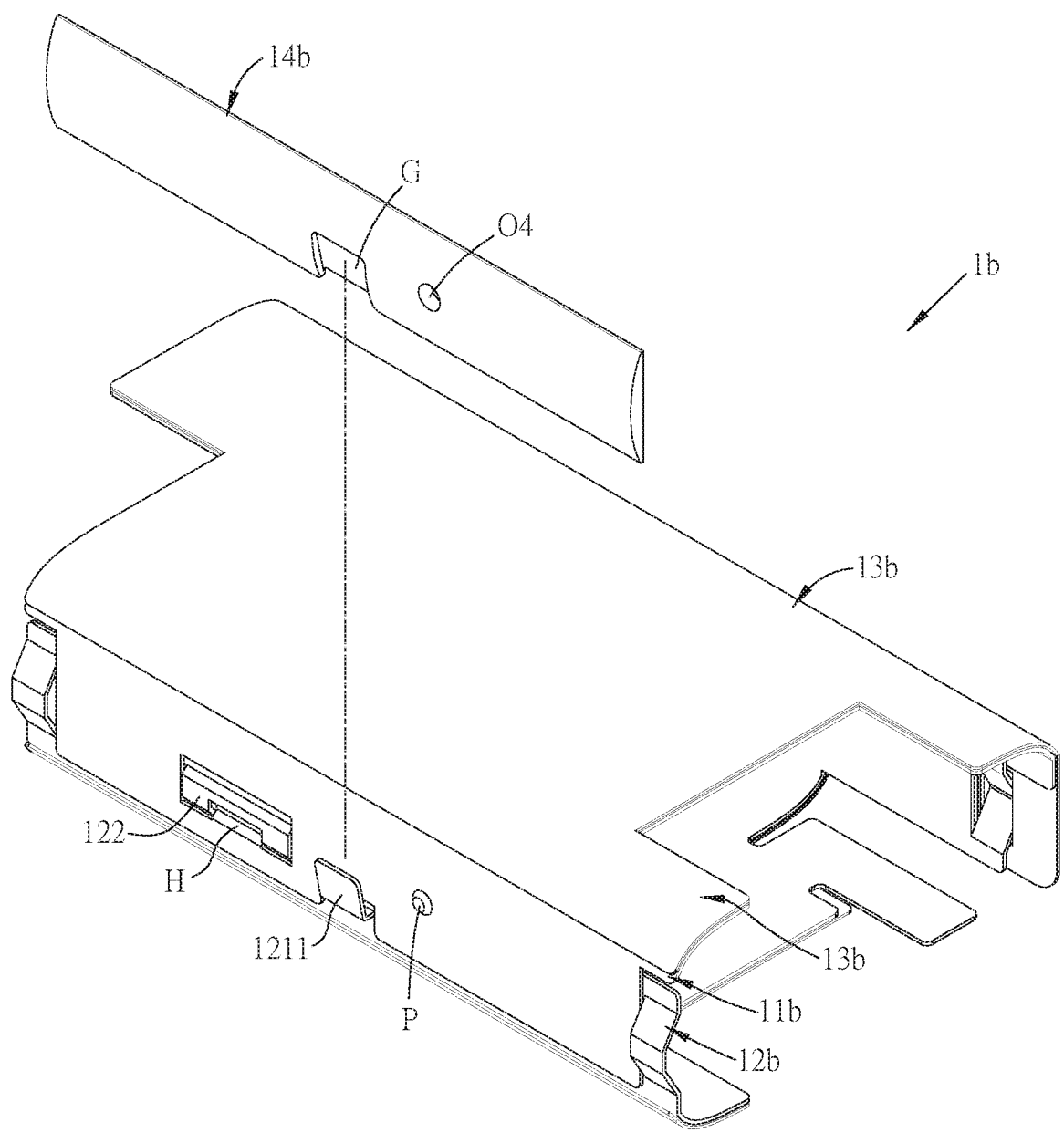
FIG. 3C is a schematic diagram showing the assembling procedure of the fixing bars of the housing of FIG. 3A.

The assembling procedure of the housing 1*b* will be described with reference to FIGS. 3A to 3C. As shown in FIG. 3C, the first cover 11*b* and the second cover 12*b* are correspondingly assembled. After assembling the first cover 11*b* with the second cover 12*b*, the first sideboard 111*b* is stacked on an outer side of the second sideboard 121*b*, the protruding platform 122 is engaged with the first opening O1, and the hook 112 is engaged with the buckle hole H (similar to FIG. 1F). Next, the third cover 13*b* is optionally provided to assemble with the first cover 11*b* and the second cover 12*b* for increasing the heat dissipation efficiency. Finally, as shown in FIG. 3C, the groove G of the fixing bar 14*b* is aligned to the third locking portion 1211 (or the second locking portion 1311*b*) of the second sideboard 121*b* (or the third sideboard 131*b*). Then, the third locking portion 1211 (or the second locking portion 1311*b*) is inserted into the groove G for locking the third locking portion 1211 (or the second locking portion 1311*b*) to the groove G, and the fourth opening O4 of the fixing bar 14*b* can be engaged with the protruding block P of the first sideboard 111*b* (or the third sideboard 131*b*), thereby finishing the assembling of the fixing bar 14*b*.

In summary, the housing of a power supply of this disclosure can directly assemble the fixing bars on the housing instead of manually operating with the jig and the positioning step of the fixing bars with the adhesive tape, so that this disclosure can reduce the assembling steps, the assembling time and the production cost, and improve the production efficiency.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A housing of a power supply, comprising:
   a first cover comprising:
     a first sideboard configured with a first opening, and
     a hook disposed aside a side edge of the first opening and protruding toward an inner side of the first cover; and
   a second cover comprising:
     a second sideboard, and
     a protruding platform disposed on the second sideboard and protruding toward an outer side of the second cover, wherein the protruding platform has a buckle hole, and when the first cover is assembled with the second cover, the first sideboard is stacked on an outer side of the second sideboard, the protruding platform is engaged with the first opening, and the hook is engaged with the buckle hole.

2. The housing of claim 1, wherein the hook has a stair-like shape, and when the first cover is assembled with the second cover, an upper edge portion of the hook contacts an inner sidewall of the protruding platform.

3. The housing of claim 2, wherein when the first cover is assembled with the second cover, a center portion of the hook contacts against a side edge of the buckle hole.

4. The housing of claim 1, wherein the first sideboard further comprises:
   at least a first locking portion extending toward an outer side of the first cover.

5. The housing of claim 4, further comprising:
   a fixing bar configured with a locking slot corresponding to the first locking portion of the first sideboard, wherein the fixing bar is rotationally locked to the first locking portion through the locking slot.

6. The housing of claim 5, wherein the first sideboard is further configured with at least a protruding block, the fixing bar is further configured with at least a third opening, and the third opening is correspondingly engaged with the protruding block.

7. The housing of claim 1, further comprising:
   a third cover configured with a third sideboard stacked on the first sideboard, wherein the third sideboard is configured with at least a second locking portion extending toward an outer side of the third cover.

8. The housing of claim 7, further comprising:
   a fixing bar configured with a locking slot corresponding to the second locking portion of the third sideboard, wherein the fixing bar is rotationally locked to the second locking portion through the locking slot.

9. The housing of claim 8, wherein the third sideboard is further configured with at least a protruding block, the fixing bar is further configured with at least a third opening, and the third opening is correspondingly engaged with the protruding block.

10. The housing of claim 1, wherein the first sideboard is further configured with a second opening, and the second sideboard is configured with a third locking portion corresponding to the second opening and extending toward the first cover.

11. The housing of claim 10, further comprising:
   a fixing bar configured with a groove corresponding to the third locking portion, wherein the fixing bar is locked to the third locking portion through the groove.

12. The housing of claim 11, wherein the first sideboard is further configured with at least a protruding block, the fixing bar is further configured with at least a fourth opening, and the fourth opening is correspondingly engaged with the protruding block.

* * * * *